United States Patent [19]
Araki

[11] Patent Number: 5,822,369
[45] Date of Patent: Oct. 13, 1998

[54] SENSOR DEVICE

[75] Inventor: Toru Araki, Itami, Japan

[73] Assignee: Mitsubishi Denki Kabushiki Kaisha, Tokyo, Japan

[21] Appl. No.: 520,364

[22] Filed: Aug. 28, 1995

[30] Foreign Application Priority Data

Sep. 13, 1994 [JP] Japan ................................ 6-219048

[51] Int. Cl.$^6$ ........................................... H03K 7/00
[52] U.S. Cl. ........................... 375/237; 327/51; 364/557
[58] Field of Search .......................... 375/237; 327/51, 327/73; 364/555, 557; 340/870.17, 870.21, 870.23

[56] References Cited

U.S. PATENT DOCUMENTS

| | | | |
|---|---|---|---|
| 3,349,390 | 10/1967 | Glassman . | |
| 4,681,440 | 7/1987 | Burke et al. | 356/218 |
| 5,369,305 | 11/1994 | Duhan et al. | 307/10.1 |
| 5,412,644 | 5/1995 | Herberle | 375/237 |

FOREIGN PATENT DOCUMENTS

| | | |
|---|---|---|
| 1259220 | 11/1989 | Japan . |
| 42122031 | 8/1992 | Japan . |

OTHER PUBLICATIONS

"From Basic Sensors to Intelligent Sensors: Definitions and Examples", E.T. Powner and F. Yalcinkaya, *Sensor Review*, vol. 15, No. 4, 1995, pp. 19–22.

*Primary Examiner*—Don N. Vo
*Attorney, Agent, or Firm*—Leydig, Voit & Mayer, Ltd.

[57] ABSTRACT

A sensor device includes a voltage-to-pulse-number converter having a timing controller. When power is supplied to the converter from a power circuit through a power line, a timer circuit inhibits itself from performing a control operation until operations of a sensor and an amplifier become stable. After a predetermined period of time has passed, the inhibition of the controls is canceled. Then, an analog-to-digital (A-D) conversion of an output of the amplifier by the A-D converter is performed. Subsequently, a counter counts down from a value obtained from the A-D conversion. When the output of the counter becomes 0, the operation of the counter is stopped. Clock signals used for the operation of the counter are input to the pulse output circuit which is enabled only when the counter operates. Thereby, the timing controller outputs to an event counter a pulse signal having a number of pulses proportional to an output of the sensor. The sensor device obtains high precision data. Further, the power consumption of the sensor device is reduced. Consequently, the load imposed on a microcomputer is lightened.

8 Claims, 15 Drawing Sheets

FIG. 13(a) VCON

FIG. 13(b) VO

SENSOR DEVICE

BACKGROUND OF THE INVENTION

1. Field of The Invention

The present invention relates to a sensor device for converting data output from various sensors, such as a pressure sensor, a light sensor (namely, a photosensor) and a temperature sensor, into digital data and for efficiently transmitting the digital data to a microcomputer.

2. Description of The Related Art

Conventional sensor devices will be described hereinbelow by referring to FIGS. 15, 16, 17 and 18 which are diagrams for illustrating sensor systems respectively containing the conventional sensor devices.

One such conventional sensor system, which is illustrated in FIG. 15, comprises a sensor 1, an amplifier 2 connected to the sensor 1, an analog-to-digital (A-D or A/D) converter 3 for outputting data in parallel, and a microcomputer 4 for performing various control operations. A data conversion instruction line or wire 5, a data transmission signal line 6 and data lines 7 are connected between the A-D converter 3 and the microcomputer 4.

Another one of the conventional sensor systems, which is illustrated in FIG. 16, comprises a sensor 1, an amplifier 2 connected to the sensor 1, an A-D converter 3 for outputting data in series, and a microcomputer 4 for performing various control operations. A data conversion instruction line 5, a data sending signal line 6, a data line 7 and a clock line 8 are connected between the A-D converter 3 and the microcomputer 4.

Still another one of the conventional sensor systems, which is illustrated in FIG. 17, comprises a sensor 1, an amplifier 2 connected to the sensor 1, a voltage-to-frequency (V-F) converter 9 for outputting frequency data, and a microcomputer 4 for performing various control operations. A data line 7 is connected between the V-F converter 9 and the microcomputer 4.

Yet another one of the conventional sensor systems, which is illustrated in FIG. 18, comprises a sensor 1, an amplifier 2 connected to the sensor 1, a voltage-to-time (V-T) converter 10 for outputting time data, and a microcomputer 4 for performing various control operations. A data conversion instruction line 5 and a data line 7 are connected between the V-T converter 10 and the microcomputer 4.

Generally, the systems illustrated in FIGS. 15 to 18 have been employed as systems for transmitting outputs of the sensor 1 to the microcomputer 4 in the case where means other than an analog voltage are used. Specifically, FIGS. 15 and 16 illustrate the systems using the A-D converter 3.

The conventional sensor system of FIG. 15 uses the A-D converter 3 which outputs data in parallel. Therefore, this conventional system requires on data lines 7 wherein, "n" is the number of bits to be transmitted simultaneously. Further, in the case of this conventional system, input/output ports of the microcomputer 4 corresponding to the data conversion line 5 and the A-D converter 3 are respectively occupied or monopolized when a data conversion instruction is output from the microcomputer 4 to the data conversion line 5 and when a data sending signal is input from the A-D converter 3 to the microcomputer 4. Thus, this system is employed or used only in the case where a sufficient number of input/output ports are provided in the microcomputer 4.

Further, the conventional sensor system of FIG. 16 employs the A-D converter 3 which outputs data in series.

Thus, this conventional system requires the data line 7, the data conversion instruction line 5, the data sending signal line 6 and the clock line 8 which transfers a clock signal or pulse issued from the microcomputer 4 and used to synchronize an operation of the A-D converter to the clock. Therefore, a number of input/output ports are occupied. Moreover, the microcomputer 4 needs to frequently exchange data with the A-D converter 3. Consequently, a high load is imposed on the microcomputer when data exchanges are performed.

The conventional sensor system of FIG. 17 employs the V-F converter 9 instead of the A-D converter 3 of FIGS. 15 and 16 for outputting data which represents a binary code. Although the frequency (more precisely, the period) of pulses outputted to the data line 7 may be read by the microcomputer 4 by means of a high-speed timer, an extremely-high-precision frequency is needed as the oscillating frequency of the V-F converter 9 for example, it is necessary that the precision of this oscillating frequency should be 10 times higher than that of the frequency employed in the sensor 1. If an accuracy of 1 to 3% is required for the sensor system, it is difficult to realize such a sensor system. Moreover, a high-speed (or high-frequency) clock is necessary for a counter of the microcomputer 4. Therefore, this conventional sensor system can not be used in the case where low power consumption is required, for example, in the case where a battery-operated system is required.

The known sensor system of FIG. 18 employs the V-T converter 10 in place of the V-F converter 9 of FIG. 17. Thus an output voltage of the sensor 1 is converted into time data. Although this V-T converter can be used in a high-precision system, a high-speed clock is also needed. Consequently, this known sensor system is suited to a case where lower power consumption is required.

Thus, the aforementioned conventional sensor systems have problems in that a large number of lines are needed and that the load imposed on the microcomputer 4 is high.

Moreover, the aforementioned conventional sensor systems have another problem that in the case of obtaining high-precision data, the conventional sensor systems require a high-speed clock and are not suitable for realizing a low-power-consumption system.

The present invention resolves the foregoing problems of the conventional sensor systems.

SUMMARY OF THE INVENTION

Accordingly, an object of the present invention is to provide a sensor device which can obtain high-precision data with low power consumption and can reduce the load imposed on a microcomputer.

To achieve the foregoing object, in accordance with an aspect of the present invention, there is provided a sensor device which comprises sensor means for detecting a physical quantity and for outputting a detection voltage corresponding to the physical quantity, amplification means for amplifying the detection voltage, and voltage-to-pulse-number conversion means for outputting a pulse signal having a number of pulses proportional to the amplified detection voltage according to, or in response to a power turn-on signal supplied from an external source. The voltage-to-pulse-number conversion means includes a clock generator, a timer circuit, a timing controller, an A-D converter and a pulse output circuit. The clock generator generates a clock signal having a predetermined frequency according to the power turn-on signal. The timer circuit outputs a timer signal having a predetermined duration according to the power turn-on signal. The timing controller inhibits itself from performing a control operation, for the predetermined duration according to the timer signal until operations of the sensor means and the amplification means become stable. Further, the timing controller causes the A-D converter to perform an A-D conversion on the amplified detection voltage. Moreover, the timing controller causes the counter to count down from a value obtained as the result of the A-D conversion to 0. Furthermore, only when the counter operates, the timing controller causes the pulse output circuit to output the clock signal, which is generated by the clock generator, as the pulse signal.

Thus, high-precision results can be obtained. Further, the power consumption can be reduced. Furthermore, the load imposed on a microcomputer connected to this sensor device can be lightened.

Further, in accordance with another aspect of the present invention, there is provided a sensor device which also comprises sensor means for detecting a physical quantity and for outputting a detection voltage corresponding to the physical quantity, amplification means for amplifying the detection voltage, and voltage-to-pulse-number conversion means for outputting a pulse signal having a number of pulses proportional to the amplified detection voltage according to a power turn-on signal supplied from an external source. The voltage-to-pulse-number conversion means includes a clock generator, a timer circuit, a timing controller, a counter, a digital-to-analog (D-A) converter, a comparator and a pulse output circuit. The clock generator generates a clock signal having a predetermined frequency according to the power turn-on signal. The timer circuit outputs a timer signal having a predetermined duration according to the power turn-on signal. The timing controller inhibits itself from performing a control operation, for the predetermined duration according to the timer signal until operations of the sensor means and the amplification means become stable. Further, the timing controller causes the counter to count up from 0. Moreover, the timing controller causes the D-A converter to perform a D-A conversion on the count obtained by the counter. Furthermore, the timing controller causes the comparator to compare an output of the D-A converter with the amplified detection voltage. Additionally, only for a period of time until the output of the D-A converter becomes equal to the amplified detection voltage, the timing controller causes the pulse output circuit to output the clock signal, which is generated by the clock generator, as the pulse signal.

Thus, a high-precision result can be obtained. Further, the power consumption can be reduced. Furthermore, the load imposed on a microcomputer connected to this sensor device can be lightened.

Moreover, in accordance with still another aspect of the present invention, there is provided a sensor device which also comprises sensor means for detecting a physical quantity and for outputting a detection voltage corresponding to the physical quantity, amplification means for amplifying the detection voltage, and voltage-to-pulse-number conversion means for outputting a pulse signal having a number of pulses proportional to the amplified detection voltage according to a data conversion instruction signal supplied from an external source. The voltage-to-pulse-number conversion means includes a clock generator, a timer circuit, a timing controller, an A-D converter, a counter and a pulse output circuit. The clock generator generates a clock signal having a predetermined frequency according to the data conversion instruction signal. The timer circuit outputs a timer signal having a predetermined duration according to the data conversion instruction signal. The timing controller inhibits itself from performing a control operation, for the predetermined duration according to the timer signal until operations of the sensor means and the amplification means become stable. Further, the timing controller causes the A-D converter to perform an A-D conversion on the amplified detection voltage. Moreover, the timing controller causes the counter to count down from a value obtained as the result of the A-D conversion to 0. Furthermore, only when the counter operates, the timing controller causes the pulse output circuit to output the clock signal, which is generated by the clock generator, as the pulse signal.

Thus, a high-precision result can be obtained. Further, the number of connecting lines can be decreased. Furthermore, this sensor device does not require many input/output ports for a microcomputer connected thereto. Consequently, the load imposed on this microcomputer can be lightened.

Furthermore, in accordance with yet another aspect of the present invention, there is provided a sensor device which also comprises sensor means for detecting a physical quantity and for outputting a detection voltage corresponding to the physical quantity, amplification means for amplifying the detection voltage, and voltage-to-pulse-number conversion means for outputting a pulse signal having a number of pulses proportional to the amplified detection voltage according to a data conversion instruction signal supplied from an external source. The voltage-to-pulse-number conversion means includes a clock generator, a timer circuit, a timing controller, a counter, a D-A converter, a comparator and a pulse output circuit. The clock generator generates a clock signal having a predetermined frequency according to the data conversion instruction signal. The timer circuit outputs a timer signal having a predetermined duration according to the data conversion instruction signal. The timing controller inhibits itself from performing a control operation, for the predetermined duration according to the timer signal until operations of the sensor means and the amplification means become stable. Further, the timing controller causes the counter to count up from 0. Moreover, the timing controller causes the D-A converter to perform a D-A conversion on the count obtained by the counter. Furthermore, the timing controller causes the comparator to compare an output of the D-A converter with the amplified detection voltage. Additionally, only for a period of time until the output of the D-A converter becomes equal to the amplified detection voltage, the timing controller causes the pulse output circuit to output the clock signal, which is generated by the clock generator, as the pulse signal.

Thus, a high-precision result can be obtained. Further, the number of connecting lines can be decreased. Furthermore, this sensor device does not require many input/output ports for a microcomputer connected thereto. Consequently, the load imposed on this microcomputer can be lightened.

BRIEF DESCRIPTION OF THE DRAWINGS

Other features, objects and advantages of the present invention will become apparent from the following description of preferred embodiments with reference to the drawings in which like reference characters designate like or corresponding parts throughout several views, and in which.

DETAILED DESCRIPTION OF THE PREFERRED EMBODIMENTS

Hereinafter, the preferred embodiments of the present invention will be described in detail by referring to the accompanying drawings.

Embodiment 1

Figure 1:
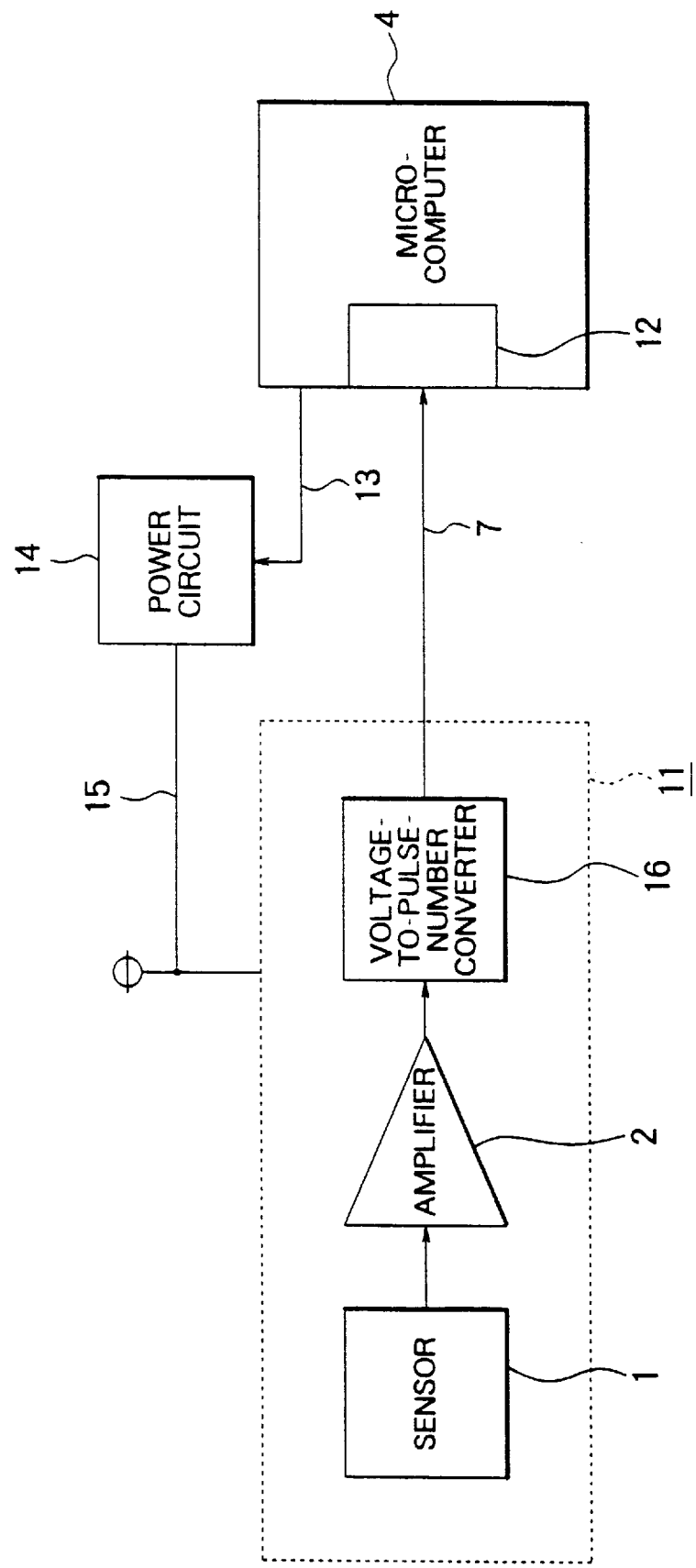
FIG. 1 is a diagram for illustrating the entire configuration of a sensor system (namely, Embodiment 1) of the present invention.
Figure 2:
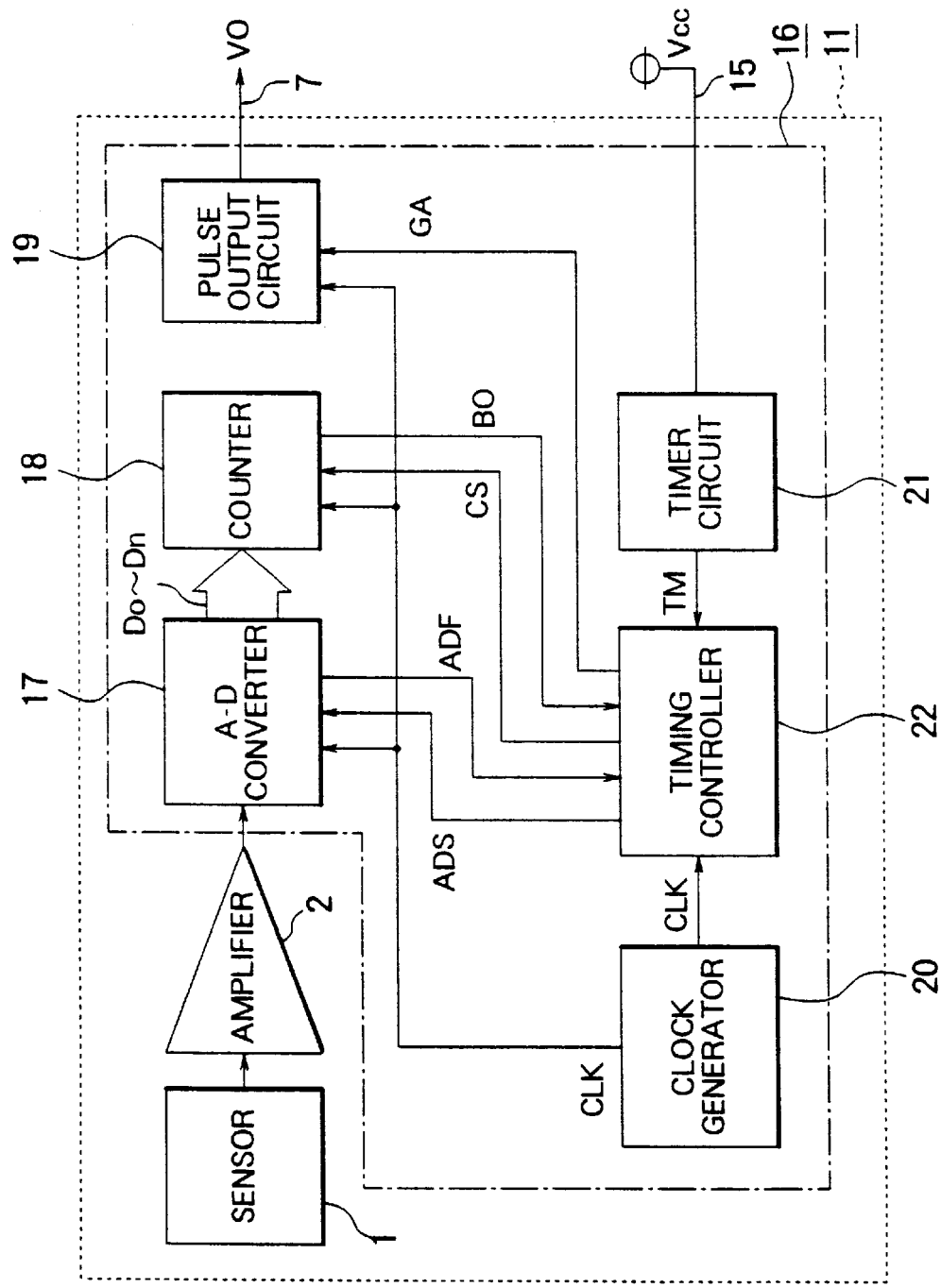
FIG. 2 is a diagram for illustrating the configuration of a pulse output sensor device of Embodiment 1 of the present invention.

The configuration of Embodiment 1 will be described by referring to FIGS. 1, 2, 3, 4, 5 and 6. FIG. 1 is a diagram for illustrating the entire configuration of a first embodiment of a sensor system of the present invention. FIG. 2 is a diagram for illustrating the configuration of a voltage-to-pulse-number converter of FIG. 1. FIGS. 3, 4, 5 and 6 are diagrams illustrating the configurations of a timer circuit, a clock generator, a timing controller and a pulse output circuit of FIG. 2, respectively.

As shown in FIG. 1, the first embodiment of the sensor system comprises a pulse output sensor device 11, a microcomputer 4 having an event counter 12 connected to the pulse output sensor device through a data line 7, and a power supply circuit 14 connected to the microcomputer 4 through an external control line 13. Further, the pulse output sensor device 11 is supplied with power from the power circuit 14 through a power line 15. The power circuit 14 is constituted by, for example, a regulator with an output control terminal to which the external control line 13 is connected. Moreover, the pulse output sensor device 11 is provided with a sensor 1, an amplifier 2 and a voltage-to-pulse-number converter 16.

If the power circuit 14 is adapted to output a normal mode voltage only when a signal having an H-level, namely, a high signal level, is sent from the microcomputer 4 to the external control line 13, and is further adapted to output 0 volts otherwise, the pulse output sensor device 11 can be operated intermittently according to the signal sent from the microcomputer 4.

After the line voltage in the power line 15 becomes equal to the normal mode voltage, the voltage-to-pulse-number converter 16 converts the voltage represented by an output signal of the amplifier 2 to a proportional number of pulses and further outputs pulses to the data line 7. Therefore, the microcomputer 4 can drive the pulse output sensor device 11 intermittently. Moreover, the microcomputer 4 can receive pulses of the number proportional to an output of the sensor 1 utilizing the event counter 12 contained therein. In this case, the gate of the event counter 12 should be enabled only when the signal level of the external control line 13 is the H-level (namely, the high signal level).

Further, a time period during which the signal level of the external control line 13 should be "H" is a sum of a time period, ta, required for stabilizing operations of the sensor 1 and the amplifier 2 and for digitizing a voltage, a time period, tb, required for outputting a pulse, and a margin time period, tc, set by considering the variation in period of a clock signal generated by a clock (device) built into the voltage-to-pulse-number converter 16. In the case of the sensor system of the first embodiment, the pulse output sensor device 11 can be operated only when necessary. For instance, if the pulse output sensor device 11 is operated intermittently at intervals of 5 seconds by setting the current consumption to 2 mA and further setting the time period during which the signal level of the external control line 13 should be the H-level for 5 ms, the average current consumption is 2 $\mu$A. Namely, the current consumption of the pulse output sensor device can be limited or reduced to very low value.

As shown in FIG. 2, the voltage-to-pulse-number converter 16 is provided with a parallel-output A-D converter 17 of, for example, the successive approximation type that converts an output voltage of the amplifier 2 into digital data, a counter 18 for counting down from the data obtained by this A-D converter 17, a pulse output circuit 19 for outputting a pulse according to an operation mode of the counter 18, a clock generator 20 for generating a clock signal having a predetermined frequency, a timer circuit 21 used at the time of turning on the power supply, and a timing controller 22 for controlling the A-D converter 17, the counter 18 and the pulse output circuit 19.

Figure 3:
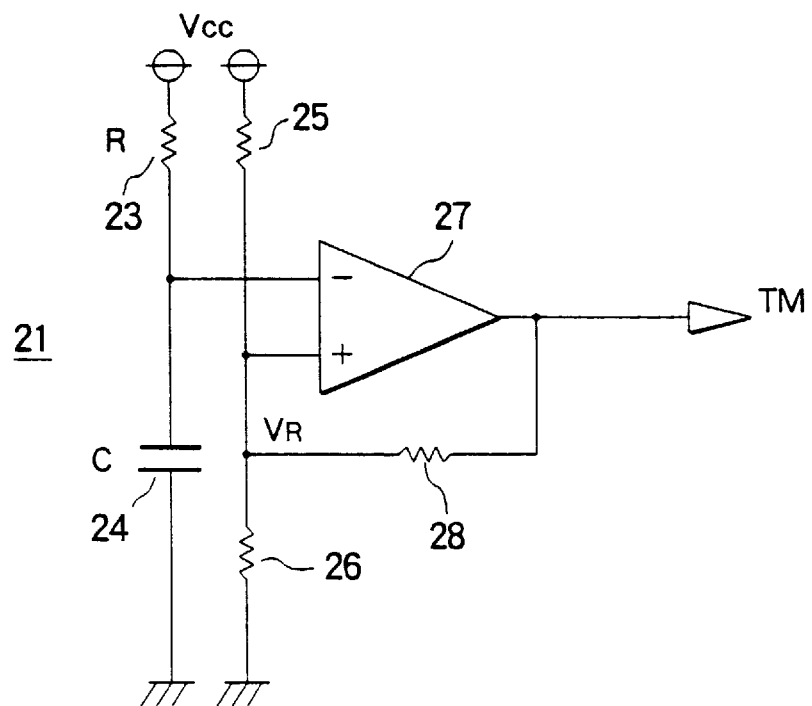
FIG. 3 is a diagram for illustrating the configuration of a timer circuit of FIG. 2.

As shown in FIG. 3, the timer circuit 21 is provided with a resistor 23 connected to a power supply Vcc, a capacitor 24 connected to this resistor 23, a resistor 25 connected to the power supply Vcc, a resistor 26 connected to the resistor 25, a comparator 27 having an inverting input terminal connected to the connecting point between the resistor 23 and the capacitor 24 and further having a non-inverting input terminal connected to the connecting point between the resistors 25 and 26, and a hysteresis resistor 28 connected between the output terminal and the non-inverting input terminal of the comparator 27. Further, the comparator 27 compares a fraction VR of the power supply voltage of the power supply Vcc with the charging voltage of the capacitor 24. Furthermore, this comparator outputs a signal TM having an H-level (namely, a high signal level) when the fraction VR of the power supply voltage is higher than the charging voltage of the capacitor.

Figure 4:
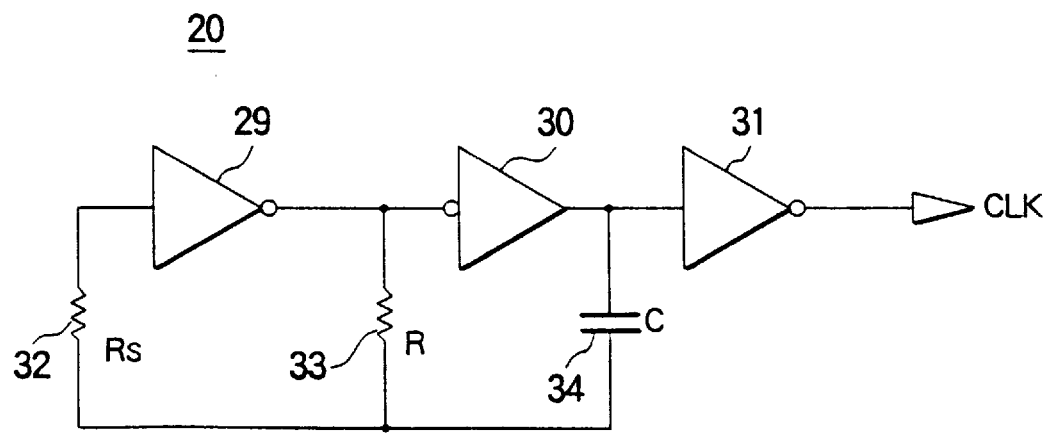
FIG. 4 is a diagram for illustrating the configuration of a clock generator of FIG. 2.

As shown in FIG. 4, the clock generator 20 is provided with inverters 29, 30 and 31, resistors 32 and 33 and a capacitor 34. Incidentally, the relation Rs≧10R holds, where Rs and R denote the resistance of the resistor 32 and that of the resistor 33, respectively.

Figure 5:
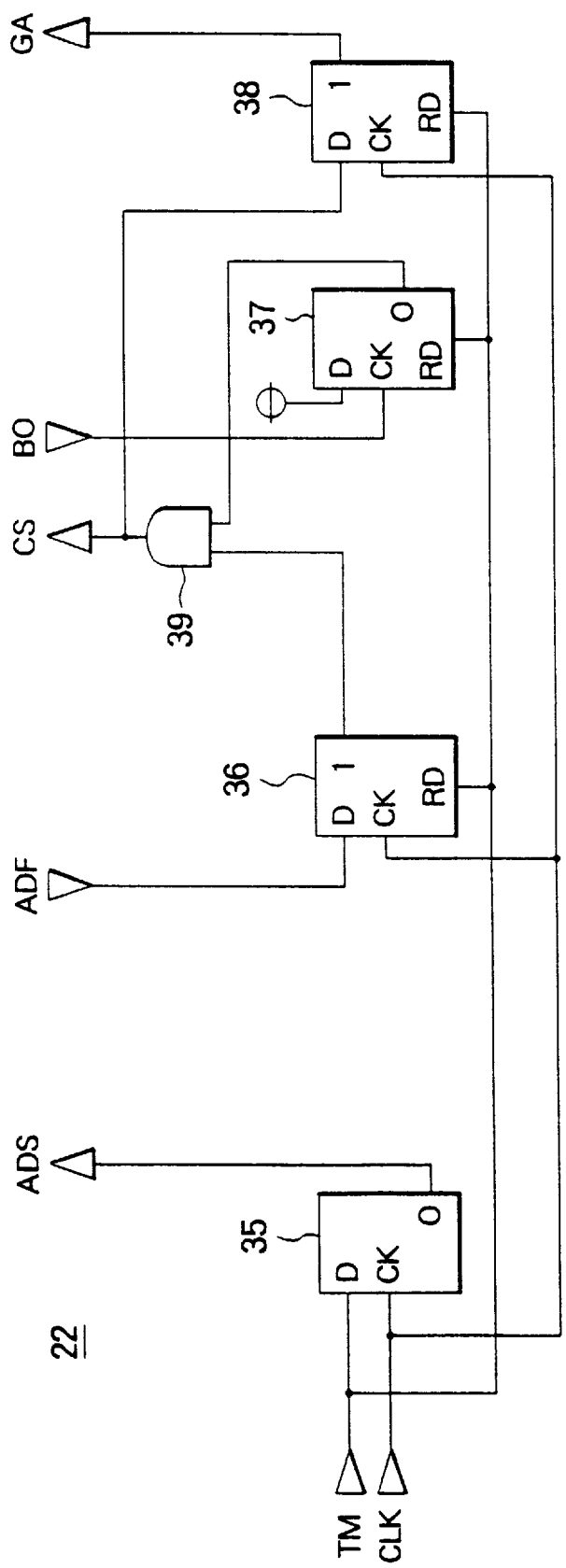
FIG. 5 is a diagram for illustrating the configuration of a timing controller of FIG. 2.

As shown in FIG. 5, the timing controller 22 is provided with four D-type flip-flops 35, 36, 37 and 38 and an AND gate 39. The timing controller 22 output signals ADS, CS and GA in synchronization with a clock signal CLK.

Figure 6:
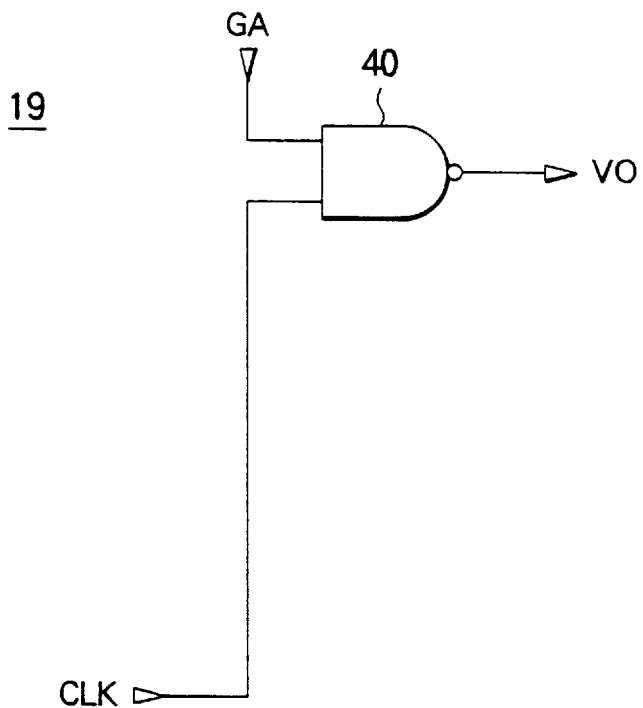
FIG. 6 is a diagram for illustrating the configuration of a pulse output circuit of FIG. 2.

As shown in FIG. 6, the pulse output circuit 19 is constituted by a NAND gate 40.

Next, an operation of the pulse output sensor device 11 will be described by referring to FIG. 7.

FIG. 7(a) illustrates the change in signal level of a power output Vcc of the power circuit 14; FIG. 7(b) illustrates the change in signal level of an output clock signal CLK of the clock generator 20; FIG. 7(c) illustrates the change in signal level of an output signal TM of the timer circuit 21; FIG. 7(d) illustrates the change in signal level of an output signal ADS of the timing controller 22; FIG. 7(e) illustrates the change in signal level of an output signal ADF of the A-D converter 17; FIG. 7(f) illustrates the change in signal level of an output signal CS of the timing controller 22; FIG. 7(g) illustrates the change in signal level of an output signal B0 of the counter 18; FIG. 7(h) illustrates the change in signal level of an output signal GA of the timing controller 22; and FIG. 7(i) illustrates the change in signal level of an output signal V0 of the pulse output circuit 19.

As illustrated in FIGS. 7(a) and 7(b), the clock generator 20 starts generating a clock signal CLK when the power supply Vcc for the pulse output sensor device 11 is turned on. The frequency f of this clock CLK is given by the following equation:

$$f \approx 1/2.2RC$$

where R and C denote the resistance of the resistor 33 and the capacity of the capacitor of FIG. 4, respectively. Incidentally, the constant 2.2 is employed in the case of a C-MOS. Further, as illustrated in FIG. 7(c), the timer circuit 21 outputs the signal TM having the H-level, namely, the high-signal-level only for a predetermined period t once the power supply Vcc is turned on. The timing controller 22 inhibits itself from performing a control operation according to or in response to this signal TM. The predetermined period t is represented by the following equation:

$$t = CR \cdot \ln(Vcc/VR - Vcc)$$

where R, C and VR denote the resistance of the resistor 23, the capacitance of the capacitor 24 and the fraction of the voltage applied to the non-inverting input terminal of the comparator, respectively. This predetermined period t is a time period required for stabilizing operations of the sensor 1 and the amplifier 2, for example, about 500 μs.

As illustrated in FIG. 7(d), when the signal level of the output signal TM of the timer circuit 21 becomes an L-level, namely, a low-signal-level, the timing controller 22 changes the signal level of the A-D conversion instruction signal ADS, which is sent to the A-D converter 17, into the H-level to cause the A-D converter to perform an A-D conversion of the output voltage of the amplifier. Next, as illustrated in FIG. 7(e), the A-D converter 17 changes the signal level of an A-D conversion finishing signal ADF into the H-level, namely, the high-signal-level when the A-D conversion is finished.

As illustrated in FIG. 7(f), when the signal level of the A-D conversion finishing signal ADF becomes the H-level, the timing controller 22 changes the signal level of the count starting signal CS, which is sent to the counter 18, into the H-level so as to cause the counter to start counting. At that time, n-bit parallel data obtained as the result of the A-D conversion is input from the A-D converter 17 to the counter 18 through lines D0 to Dn. For instance, if the counter 18 counts down from this parallel data and thereafter the counter 18 is stopped when the count value indicated by the counter 18 becomes 0, the value of the parallel data obtained by the A-D conversion comes to be proportional to the operating time of the counter 18. Reference characters B0 in FIGS. 7(f) and 7(g) designate a borrow signal whose signal level becomes the H-level when the count value indicated by the counter 18 becomes 0.

Figure 7:
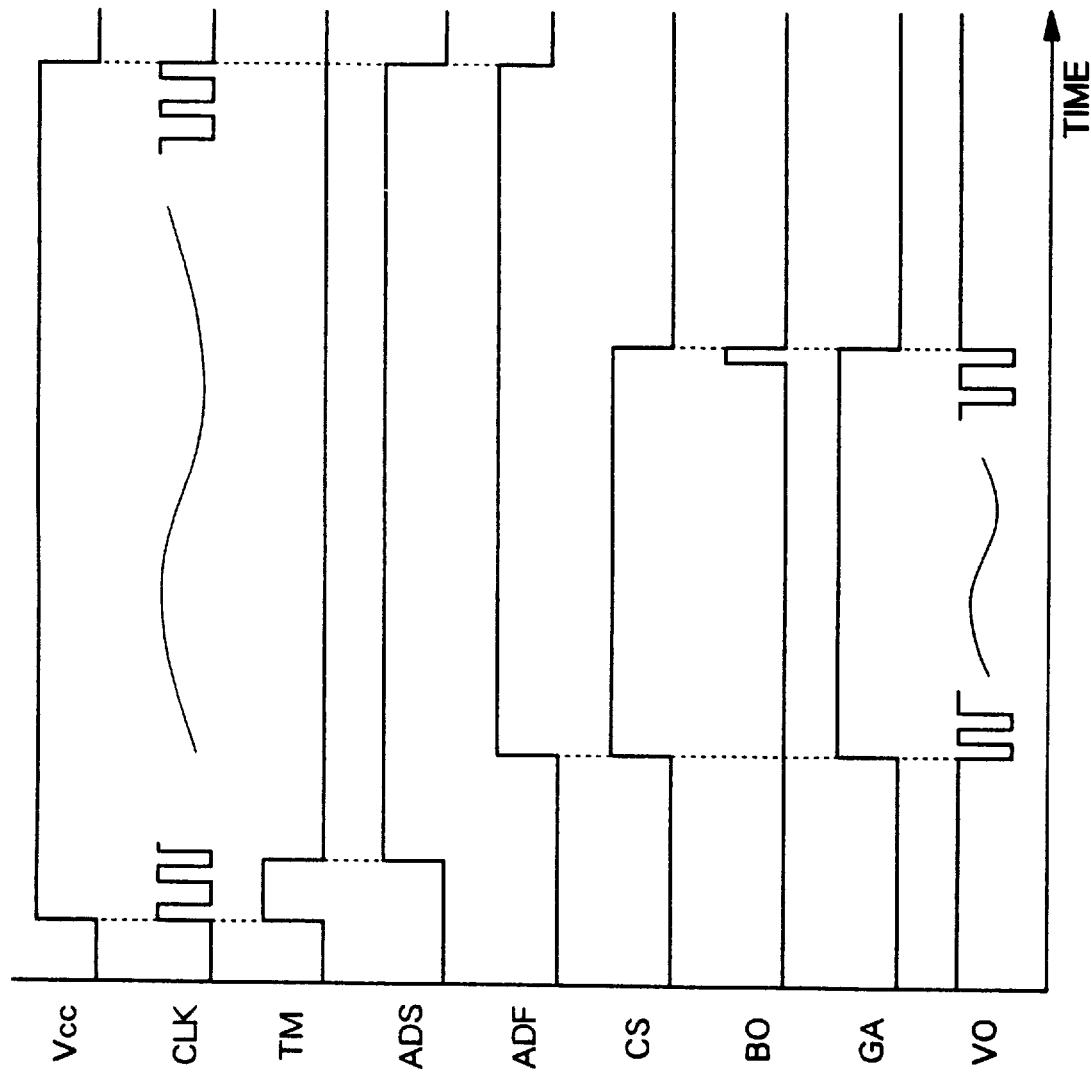
FIGS. 7(a)–7(i) are timing diagrams for illustrating an operation of the pulse output sensor device of Embodiment 1 of the present invention.

As shown (f) and (g) in FIG. 7, when the signal level of the borrow signal B0 becomes the H-level, the timing controller 22 changes the signal level of the count starting signal CS into the L-level and further stops the counter 18. The timing controller 22 outputs a gate signal GA, which is the same as the count starting signal CS, to the gate of the pulse output circuit 19. As shown in FIGS. 7(h) and 7(i), the pulse output circuit 19 outputs a clock signal CLK as a pulse signal V0 only when the signal level of the gate signal GA is at the H-level.

As described above, the counter counts down from the parallel data, which is outputted by the A-D converter 17, by one and the pulse output circuit 19 outputs the clock signals CLK while counting down. Consequently, the pulse output circuit comes to output pulses, the number of which is proportional to the value detected by the sensor 1, to the data line 7. Further, this operation is performed when the signal (Vcc) input through the power line 15 to the pulse output sensor device 11 is the H-level. Thus the microcomputer 4 can read the data, which is obtained by the sensor, whenever the data is necessary. In contrast, when the data output from the sensor 1 is unnecessary, the level of the power input through the power line 15 to the pulse output sensor device 11 can be made to remain at 0. Thereby, a high-precision result can be obtained by the system. Moreover, the power consumption of the system can be limited to low value.

Embodiment 2

Figure 8:
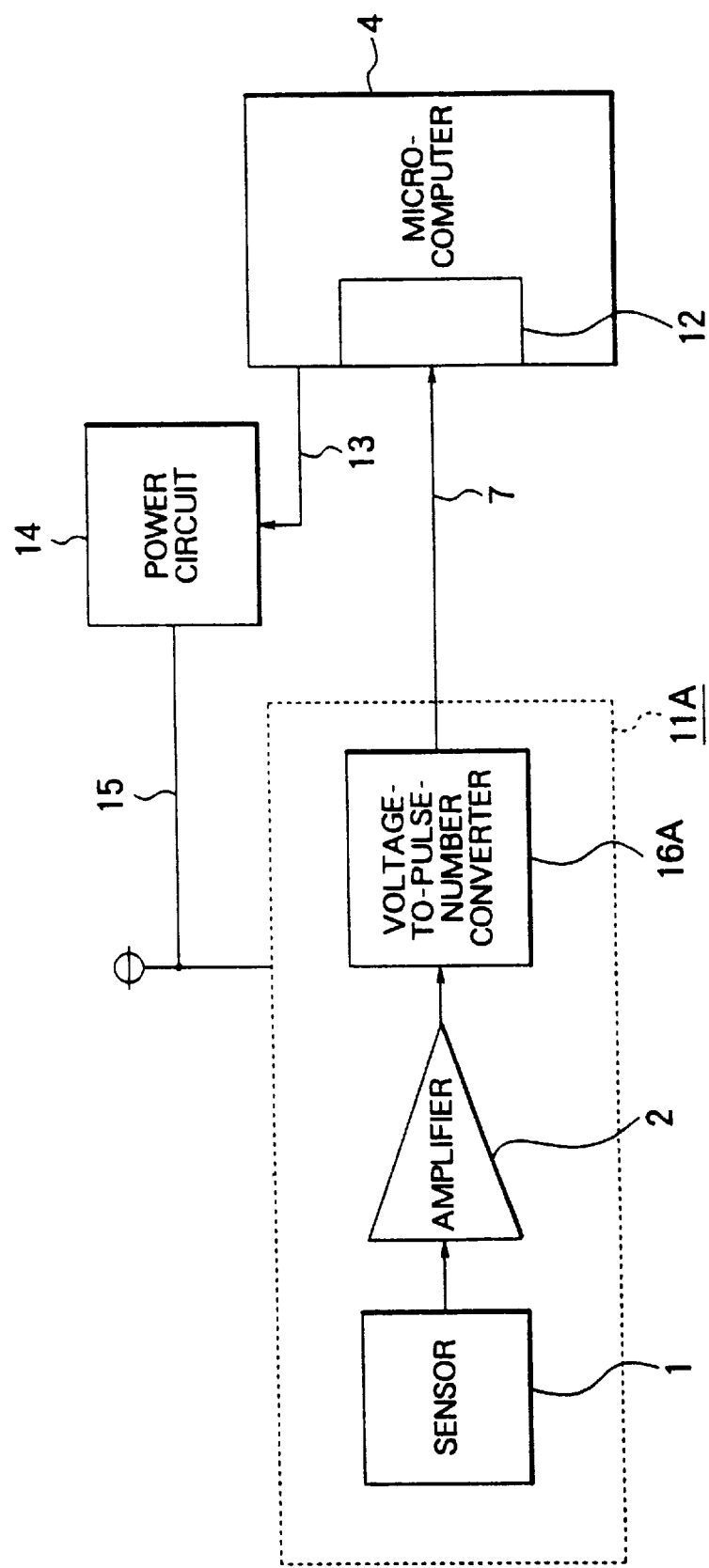
FIG. 8 is a diagram for illustrating the entire configuration of another sensor system (namely, Embodiment 2) of the present invention.
Figure 9:
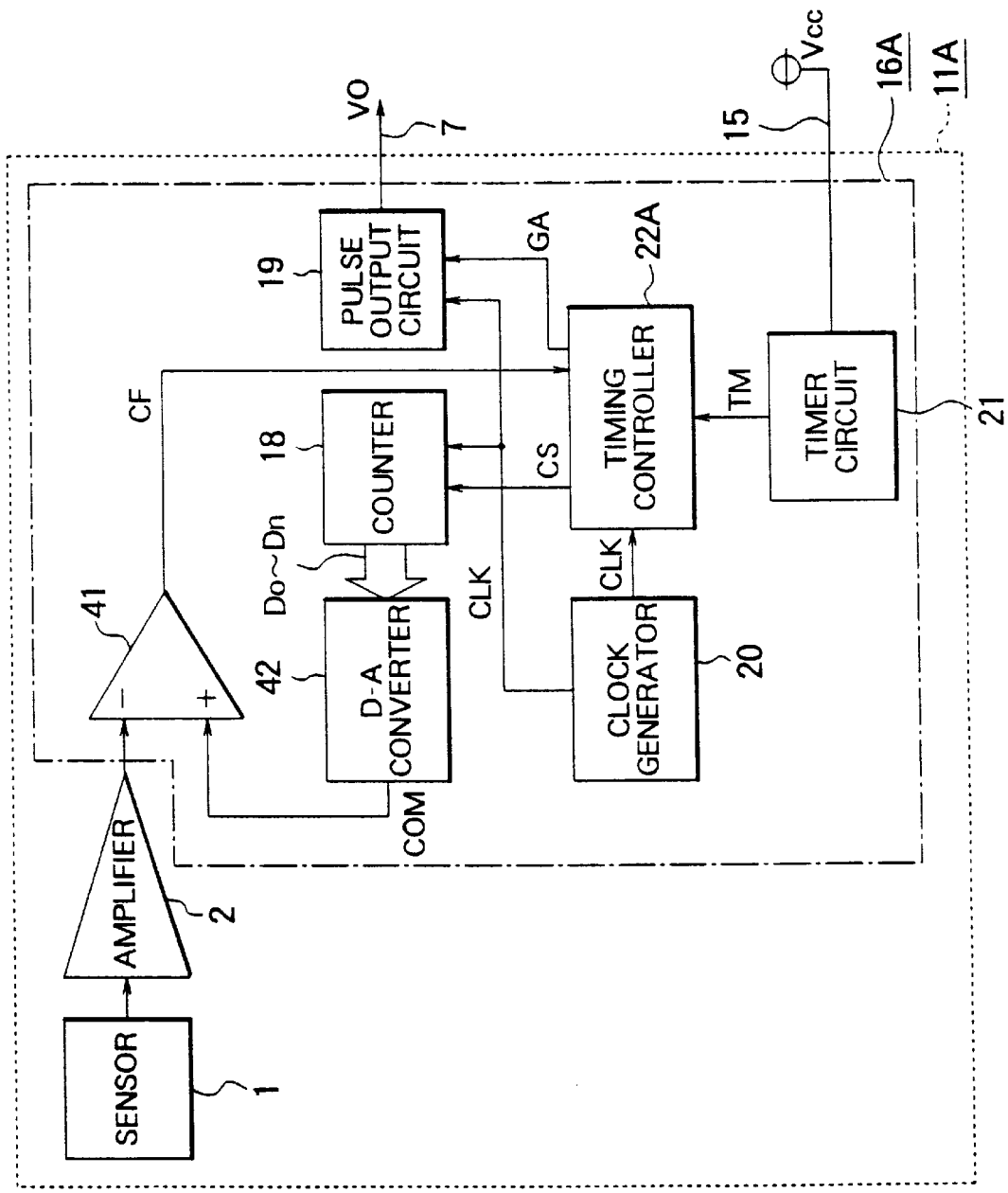
FIG. 9 is a diagram for illustrating the configuration of a pulse output sensor device of Embodiment 2 of the present invention.
Figure 10:
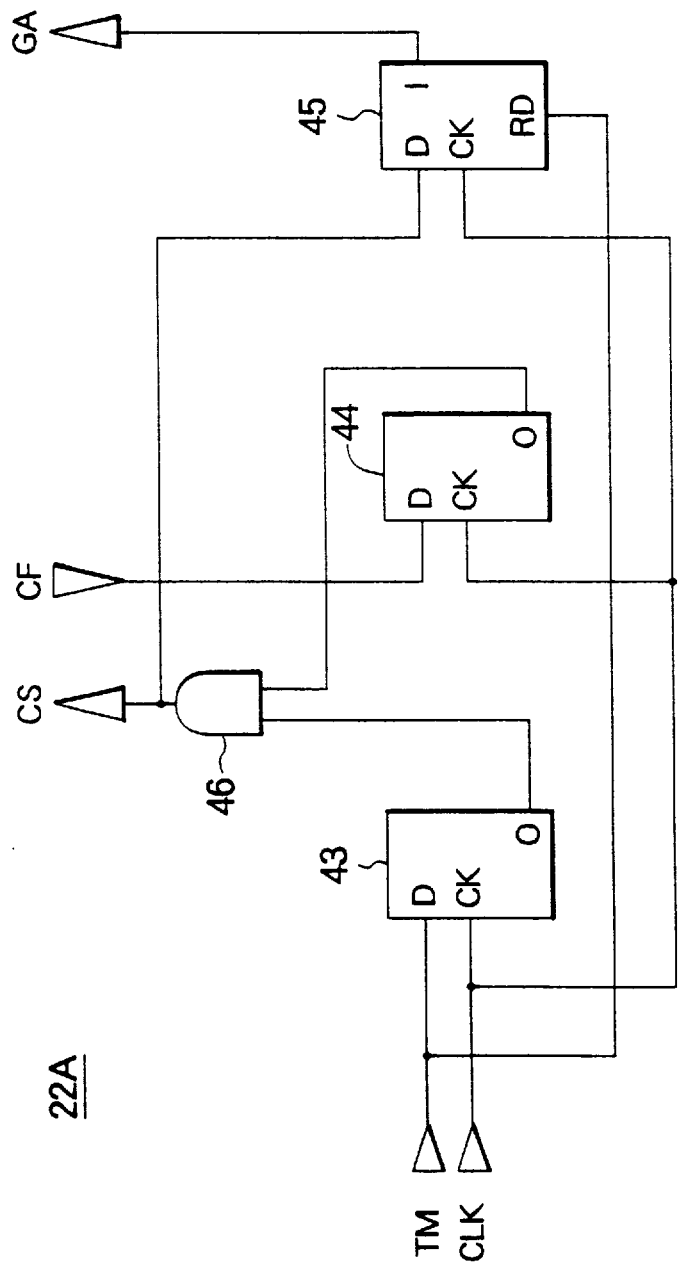
FIG. 10 is a diagram for illustrating the configuration of a timing controller of FIG. 9.
Figure 11:
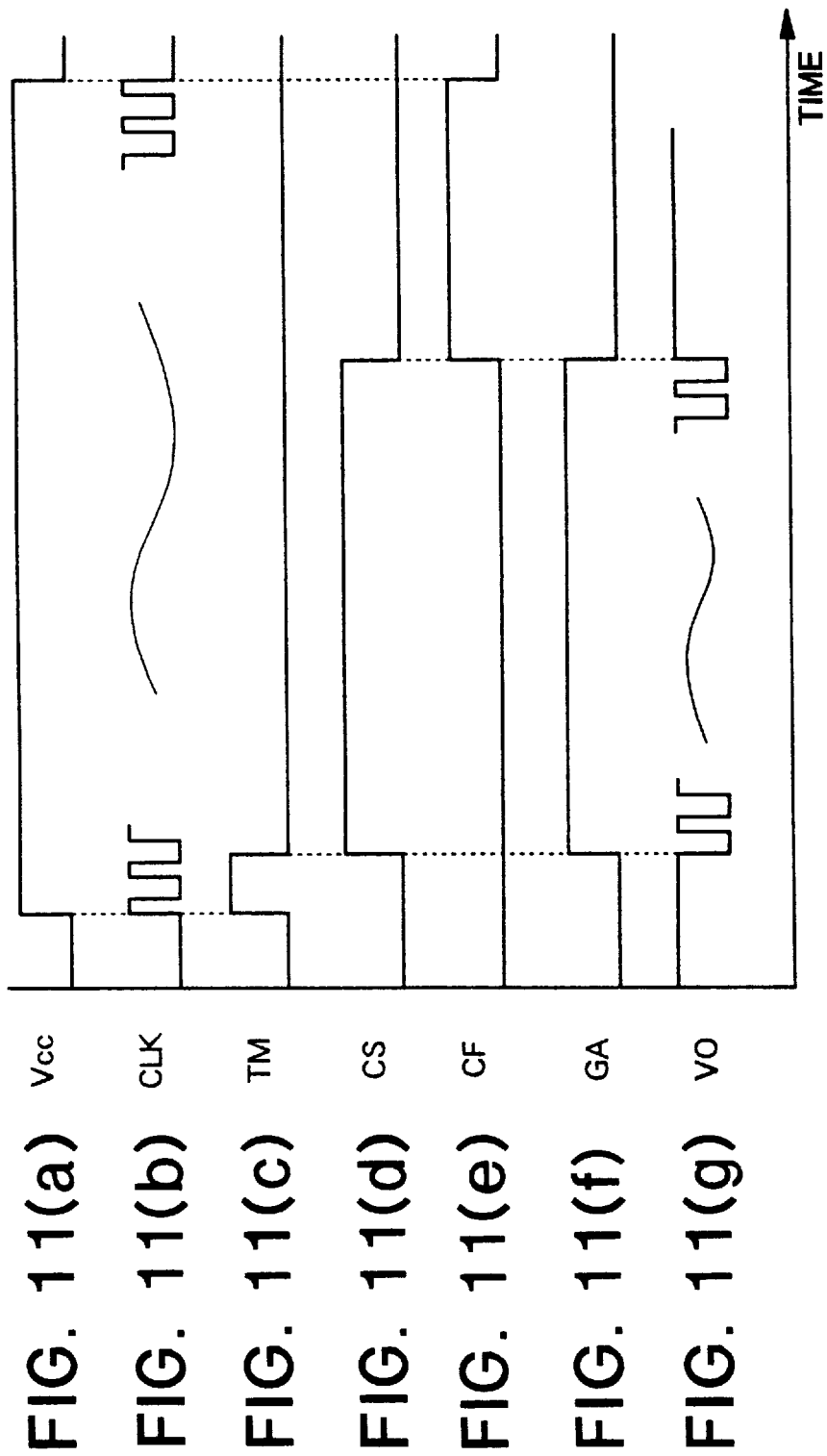
FIGS. 11(a)–11(g) are timing diagrams for illustrating an operation of the pulse output sensor device of Embodiment 2 of the present invention.

The second embodiment of the sensor system of the present invention will be described by referring to FIGS. 8, 9, 10 and 11(a)–11(g). FIG. 8 is a diagram for illustrating the entire configuration of the second embodiment of the sensor system of the present invention. Further, FIG. 9 is a diagram for illustrating the configuration of a pulse output sensor device of FIG. 8. Moreover, FIG. 10 is a diagram for illustrating the configuration of a timing controller of FIG. 9. FIG. 11 is a timing chart for illustrating an operation of the pulse output sensor device the second embodiment of the present invention.

As shown in FIG. 9, the sensor system employs a D-A converter 42 and a comparator 41 instead of the A-D converter 17 of the aforementioned first embodiment. Further, as shown in FIG. 10, the timing controller 22A is provided with three D-type flip-flops 43, 44 and 45 and an AND-gate 46. The timing controller 22A outputs signals CS and GA in synchronization with a clock signal CLK. Furthermore, the other elements comprising the second embodiment are the same as the corresponding elements comprising the first embodiment.

As illustrated in FIGS. 11(a) and 11(c), when the level of a power supply signal Vcc becomes the H-level, a timer circuit 21 of the voltage-to-pulse-number converter 16A operates. Further, for a predetermined time period t, the power supply signal Vcc has the H-level. During this time period, the timing controller 22A inhibits itself from controlling other composing elements of the voltage-to-pulse-number converter.

As illustrated in FIG. 11(d), when the signal level of the signal TM becomes the L-level, the timing controller 22 changes the signal level of the count starting signal CS into the H-level. In response to this, the counter 18 counts up from 0. Then, parallel data is output from this counter 18 to lines D0 to Dn and is further input to the D-A converter 42. Subsequently, the D-A converter 42 outputs an analog voltage COM according to this parallel data.

An output COM of this D-A converter 42 is compared with an output of the amplifier 2 in the comparator 41. If the output COM of the D-A converter 42 is less than that of the amplifier 2, the signal level of an output signal CF of the comparator 41 becomes the L-level. However, as illustrated in FIG. 11(e), as the counter 18 is incremented, the output COM of the D-A converter 42 increases. When the output COM of this D-A converter exceeds that of the amplifier 2, the signal level of the output signal CF of the comparator 41 becomes the H-level.

As illustrated in FIGS. 11(d)–11(g), when the signal level of the output signal CF of the comparator 41 becomes the H-level, the timing controller 22A changes the signal level of the count starting signal CS into the L-level and stops the counting operation of the counter 18. During this count starting signal CS has the H-level, the timing controller changes the signal level of the gate signal GA into the H-level and thus enables the gate of the pulse output circuit 19. During this, the pulse output circuit outputs the clock signal CLK as a pulse signal V0. Thus, the number of pulses corresponding to a value detected by the sensor 1 are output from the pulse output circuit 19.

Embodiment 3

Figure 12:
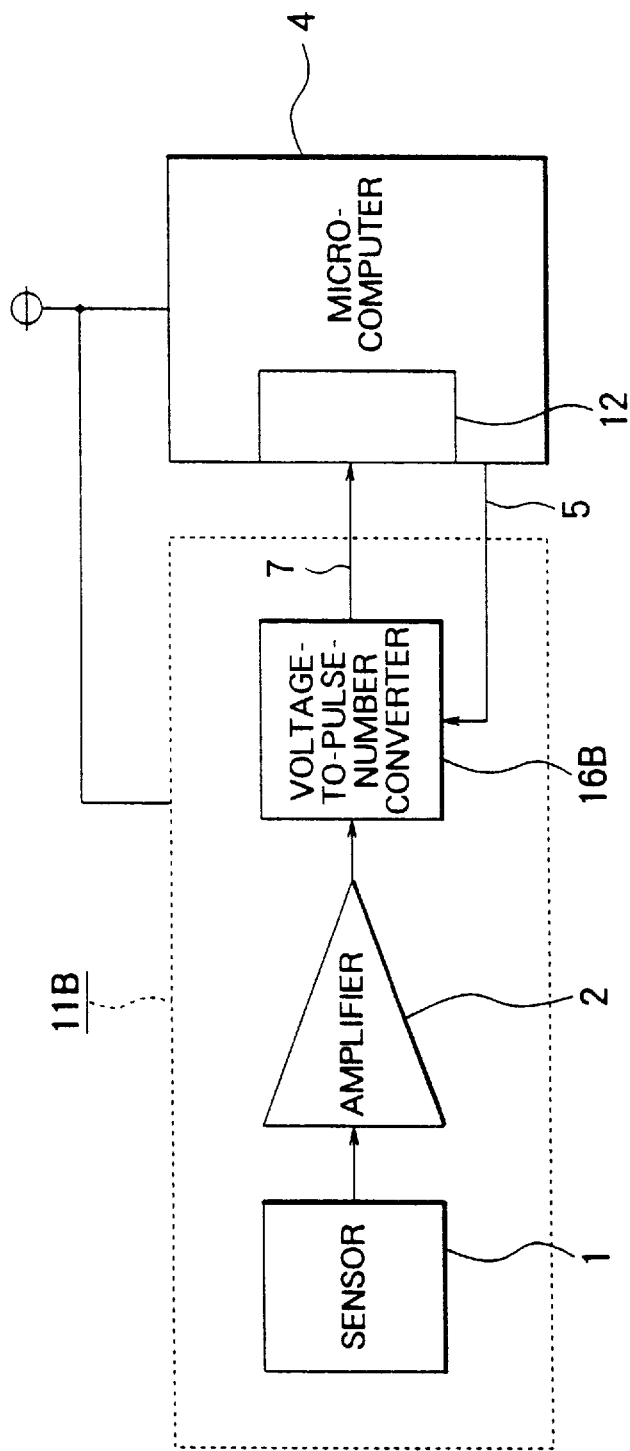
FIG. 12 is a diagram for illustrating the entire configuration of still another sensor system (namely, Embodiment 3) of the present invention.
Figure 13:
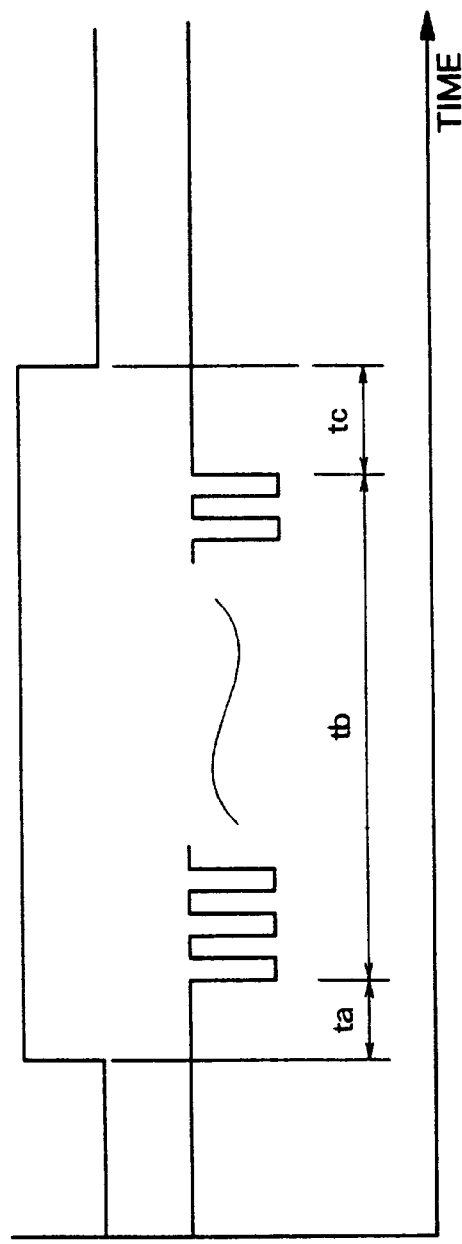
FIGS. 13(a) and 13(b) are timing diagrams for illustrating an operation of a pulse output sensor device of Embodiment 3 of the present invention.

Hereinafter, the third embodiment of the sensor system of the present invention will be described by referring to FIGS. 12 and 13. FIG. 12 is a diagram for illustrating the entire configuration of still another sensor system embodying the present invention, namely, the third embodiment of the present invention. FIGS. 13(a) and 13(b) are timing diagrams for illustrating an operation of a pulse output sensor device of FIG. 12.

As shown in FIG. 12, the pulse output sensor device 11B is provided with a sensor 1 such as a pressure sensor, an amplifier 2 for amplifying an output signal of the sensor 1, and a voltage-to-pulse-number converter 16B for converting a voltage signal, which is output from the amplifier 2, to a signal representing the number of pulses. The configuration of the voltage-to-pulse-number converter 16B is similar to that of the voltage-to-pulse-number converter 16 of the aforementioned first embodiment. Additionally, the timer circuit 21 of the third embodiment is a logic circuit for generating a signal TM from a data conversion instruction signal Vcon corresponding to the power output Vcc of the first embodiment. Further, similarly, the clock generator 20 produces a clock signal according to the data conversion instruction signal Vcon. When a microcomputer 4 outputs a data conversion instruction signal Vcon to the voltage-to-pulse-number converter 16B through a data conversion instruction line 5, an output V0 of the voltage-to-pulse-number converter 16B is transmitted through a data line 7 to an event counter 12 contained in the microcomputer 4.

On the other hand, an output signal of the sensor 1 is amplified by the amplifier 2. A voltage signal output from this amplifier 2 is converted by the voltage-to-pulse-number converter 16B into a pulse-number signal representing the number of pulses. This pulse-number signal is transmitted through the data line 7 to the event counter 12 of the microcomputer 4. In the case where the sensor 1 is a pressure sensor, the value of a pressure can be obtained by reading the value indicated by the event counter 12 by means of the microcomputer 4 if the system is established in such a manner that, for example, when the pressure is 0 atm., the number of pulses is 10, when the pressure is 1 atm., the number of pulses is 1000 and if the pressure has an intermediate value between 0 and 1 atm., the number of pulses is proportional to the pressure (incidentally, in this case, the event-counter size should be at least 10 bits).

The voltage-to-pulse-number converter 16B, however, can not output pulses at all times. Therefore, as illustrated in FIGS. 13(a) and 13(b), this converter outputs pluses only for a time period tb after another predetermined time period ta has passed once the signal level of the data conversion instruction signal Vcon becomes the H-level. The length of the time period tb varies in proportion to the output of the sensor 1. Thus, the maximum length of the time period tb is the product of the maximum output of the sensor 1 (namely, the maximum number of pulses) and the period of a clock signal generated by a clock (device) built into the voltage-to-pulse-number converter 16B. Therefore, the length of the time, during which the data conversion instruction signal Vcon has the H-level, is the sum of the length of the time period ta, the maximum length of the time period tb and the length of a margin time period tc set by considering the variation in period of the clock signal.

Further, in the case of the third embodiment, it is necessary to enable the gate of the event counter of the microcomputer 4 during the data conversion instruction signal Vcon has the H-level. During the period in which this signal Vcon is caused to have the H-level, the microcomputer 4 can perform another task or job. Even after data is captured by the system, the microcomputer 4 can read data held in the event counter 12 whenever the data is necessary. Thus the load imposed on the microcomputer 4 is extremely low. The precision of the clock (device) built into the voltage-to-pulse-number converter 16B is unrelated to the measurement accuracy of the sensor system. The clock generator 20 may be a simple oscillator circuit consisting of capacitors and resistors. The cost of the system can be reduced to a low value. Moreover, the self-contained clock (device) of the microcomputer 4 may be a low-speed or low-frequency one. Thus the power consumption of the system can be easily reduced to a low level. Further, this sensor device is best-suited to a battery-operated system. Furthermore, the number of lines used to connect the sensor device 11B with the microcomputer 4 may be small.

Embodiment 4

Figure 14:
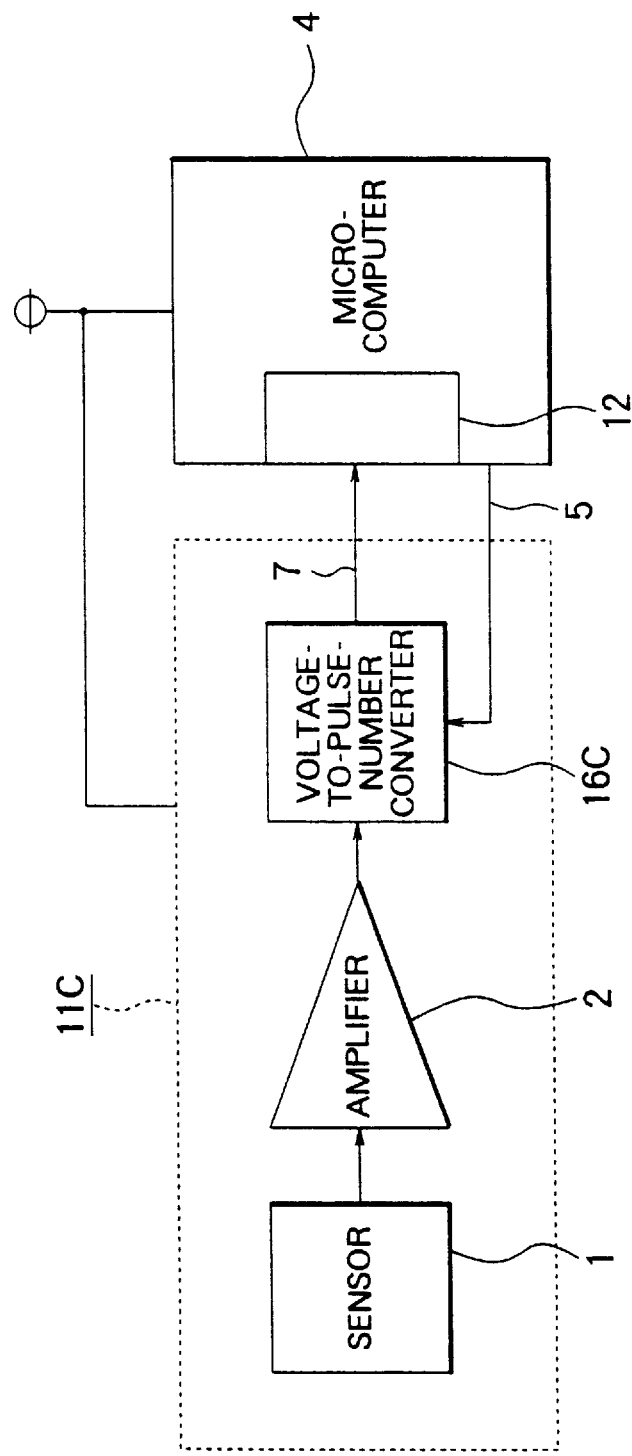
FIG. 14 is a diagram for illustrating the entire configuration of yet another sensor system (namely, Embodiment 4) of the present invention.
Figure 15:
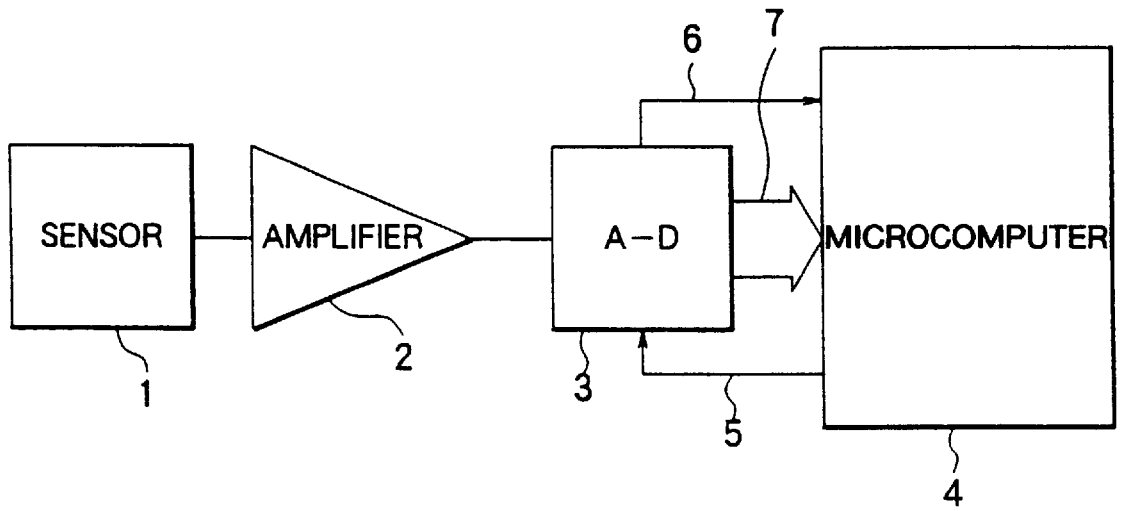
FIG. 15 is a diagram for illustrating the entire configuration of a conventional sensor system.
Figure 16:
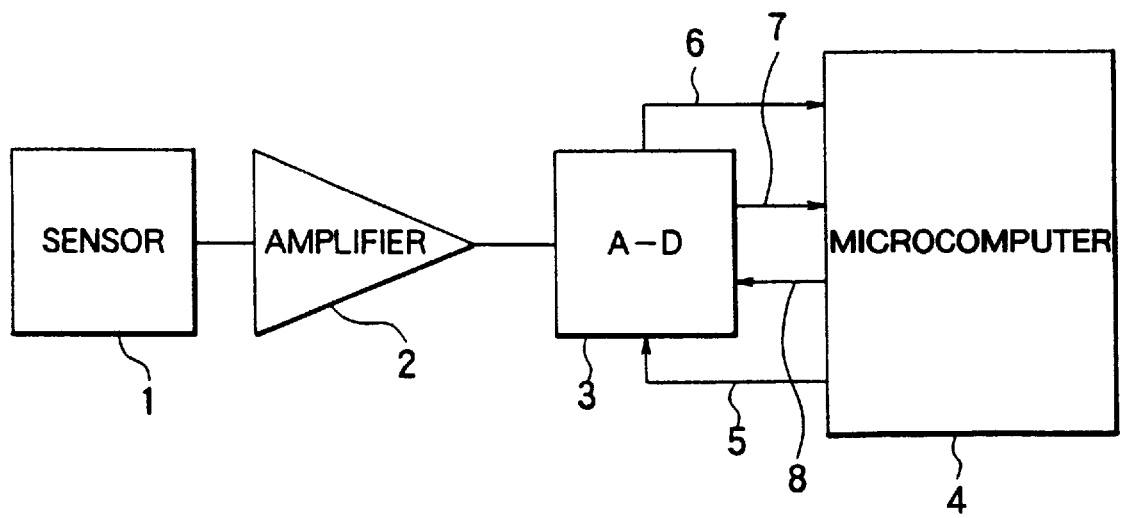
FIG. 16 is a diagram for illustrating the entire configuration of another conventional sensor system.
Figure 17:
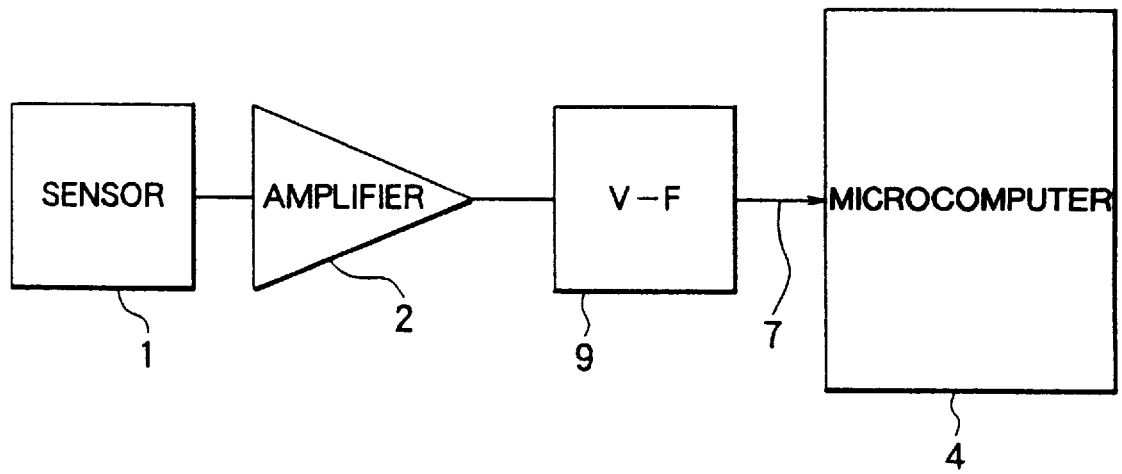
FIG. 17 is a diagram for illustrating the entire configuration of still another conventional sensor system.
Figure 18:
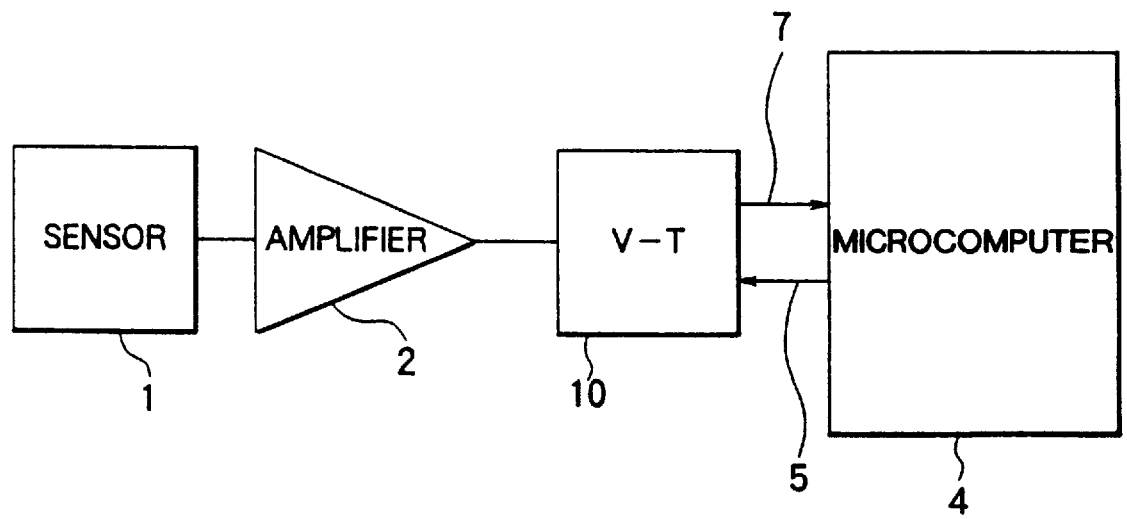
FIG. 18 is a diagram for illustrating the entire configuration of a privately known but unpublished sensor system.

A fourth embodiment of the sensor system of the present invention will be described by referring to FIG. 14. Further, FIG. 14 is a diagram for illustrating the entire configuration of yet another sensor system (namely, Embodiment 4) of the present invention Although the configuration of the voltage-to-pulse-number converter 16B of the aforementioned Embodiment 3 is similar to that of the voltage-to-pulse-number converter 16 of the aforesaid Embodiment 1, the configuration of a voltage-to-pulse-number converter 16C of this Embodiment 4 is similar to that of the voltage-to-pulse-number converter 16A of the aforementioned Embodiment 2. Incidentally, a timer circuit 21 of Embodiment 4 is a logic circuit which generates a signal TM from a data conversion instruction signal Vcon corresponding to a power supply Vcc. Further, similarly, a clock generator 20 generates clock signals according to the data conversion instruction signal Vcon. When the data conversion instruction signal Vcon is outputted from the microcomputer 4 to the voltage-to-pulse-number converter 16C through a data conversion instruction line 5, an output V0 of the voltage-to-pulse-number converter 16C is transmitted to an event counter 12 built into the microcomputer 4 through a data line 7. This Embodiment 4 has effects or advantages similar to those of the aforementioned Embodiment 3.

Although the preferred embodiments of the present invention have been described above, it should be understood that the present invention is not limited thereto and that other modifications will be apparent to those skilled in the art without departing from the spirit of the invention.

The scope of the present invention, therefore, is to be determined solely by the appended claims.

What is claimed is:

1. A sensor device comprising:

sensor means for detecting a physical Quantity and for outputting a detection voltage corresponding to the physical quantity;

amplification means for amplifying the detection voltage and producing an amplified detection voltage; and voltage-to-pulse-number conversion means for outputting a pulsed signal having a number of pulses proportional to the amplified detection voltage according to a data transmission requesting signal supplied from an external source, wherein the data transmission requesting signal is a power turn-on signal supplied from the external source, and the voltage-to-pulse-number conversion means comprises:

a clock generator;
a timing controller;
an analog-to-digital converters a counter; and
a pulse output circuit, wherein:
the clock generator generates a clock signal having a predetermined frequency, according to the power turn-on signal,
the timing controller causes the analog-to-digital converter to perform an analog-to-digital conversion of the amplified detection voltage,
the timing controller causes the counter to count down from a value obtained as the result of the analog-to-digital conversion to 0, and
the timing controller causes the pulse output circuit to output the clock signal generated by the clock generator as the pulsed signal only when the counter operates.

2. The sensor device as set forth in claim 1, wherein the voltage-to-pulse-number conversion means comprises a timer circuit for outputting a timer signal having a first duration according to the power turn-on signal, wherein the timing controller inhibits itself from performing a control operation for the first duration, until operations of the sensor means and the amplification means become stable.

3. A sensor device comprising:

sensor means for detecting a physical quantity and for outputting a detection voltage corresponding to the physical quantity;

amplification means for amplifying the detection voltage and producing an amplified detection voltage; and voltage-to-pulse-number conversion means for outputting a pulsed signal having a number of pulses proportional to the amplified detection voltage according to a data transmission requesting signal supplied from an external source, wherein the data transmission requesting signal is a power turn-on signal supplied from the external source, and the voltage-to-pulse-number conversion means includes:

a clock generator;
a timing controller;
a counter;
a digital-to-analog converter;
a comparator; and
a pulse output circuit, wherein:
the clock generator generates a clock signal having a first frequency, according to the power turn-on signal,
the timing controller causes the counter to count up from 0,
the timing controller causes the digital-to-analog converter to perform a digital-to-analog conversion of a count obtained by the counter,
the timing controller causes the comparator to compare an output of the digital-to-analog converter with the amplified detection voltage, and
the timing controller causes the pulse output circuit to output the clock signal generated by and sent from the clock generator as the pulsed signal only until the output of the digital-to-analog converter equals the amplified detection voltage.

4. The sensor device as set forth in claim 3, wherein the voltage-to-pulse-number conversion means comprises a timer circuit for outputting a timer signal having a first duration according to the power turn-on signal, wherein the timing controller inhibits itself from performing a control operation for the first duration, until operations of the sensor means and the amplification means become stable.

5. A sensor device comprising:

sensor means for detecting a physical quantity and for outputting a detection voltage corresponding to the physical quantity;

amplification means for amplifying the detection voltage and producing an amplified detection voltage; and voltage-to-pulse-number conversion means for outputting a pulsed signal having a number of pulses proportional to the amplified detection voltage according to a data transmission requesting signal supplied from an external source, wherein the data transmission requesting signal is a data conversion instruction signal sent from the external source, and the voltage-to-pulse-number conversion means comprises:

a clock generator;
a timing controller;
an analog-to-digital converter;
a counter; and
a pulse output circuit, wherein:
the clock generator generates a clock signal having a first frequency, according to the data conversion instruction signal, the timing controller causes the analog-to-digital converter to perform an analog-to-digital conversion of the amplified detection voltage, the timing controller causes the counter to count down from a value obtained as the result of the analog-to-digital conversion to 0, and the timing controller causes the pulse output circuit to output the clock signal generated by the clock generator as the pulsed signal only when the counter operates.

6. The sensor device as set forth in claim 5, wherein the voltage-to-pulse-number conversion means comprises a timer circuit for outputting a timer signal having a first duration according to the data conversion instruction signal, wherein the timing controller inhibits itself from performing a control operation for the first duration, until operations of the sensor means and the amplification means become stable.

7. A sensor device comprising:

sensor means for detecting a physical quantity and for outputting a detection voltage corresponding to the physical quantity;

amplification means for amplifying the detection voltage and producing an amplified detection voltage; and voltage-to-pulse-number conversion means for outputting a pulsed signal having a number of pulses proportional to the amplified detection voltage according to a data transmission requesting signal supplied from an external source, wherein the data transmission requesting signal is a data conversion instruction signal sent from the external source, and the voltage-to-pulse-number conversion means comprises:

a clock generator;

a timing controller;

a counter;

a digital-to-analog converter;

a comparator; and a pulse output circuit, wherein:

the clock generator generates a clock signal having a first frequency according to the data conversion instruction signal, the timing controller causes the counter to count up from 0, the timing controller causes the digital-to-analog converter to perform a digital-to-analog conversion of a count produced by the counter, the timing controller causes the comparator to compare the output of the digital-to-analog converter with the amplified detection voltage, and the timing controller causes the pulse output circuit to output the clock signal generated by the clock generator as the pulsed signal only until the output of the digital-to-analog converter becomes equal to the amplified detection voltage.

8. The sensor device as set forth in claim 7, wherein the voltage-to-pulse-number conversion means comprises a timer circuit for outputting a timer signal having a first duration according to the data conversion instruction signal, wherein the timing controller inhibits itself from performing a control operation for the first duration, until operations of the sensor means and the amplification means become stable.

* * * * *

UNITED STATES PATENT AND TRADEMARK OFFICE
CERTIFICATE OF CORRECTION

PATENT NO. : 5,822,369
DATED : October 13, 1998
INVENTOR(S) : Araki

It is certified that error appears in the above-identified patent and that said Letters Patent is hereby corrected as shown below:

Column 11, Line 33, change "Quantity" to --quantity--;

Line 48, change "converters" to

--converter;--;

Line 48, move "a counter; and" to the next line as a separate paragraph.

Signed and Sealed this

Twelfth Day of January, 1999

Attest:

Attesting Officer    *Acting Commissioner of Patents and Trademarks*